United States Patent
Nguyen et al.

(10) Patent No.: US 12,142,632 B2
(45) Date of Patent: *Nov. 12, 2024

(54) ELECTRONIC DEVICES WITH FOLDING DISPLAYS HAVING TEXTURED FLEXIBLE AREAS

(71) Applicant: Apple Inc., Cupertino, CA (US)

(72) Inventors: Que Anh S. Nguyen, San Jose, CA (US); Christian Weddeling, Niefern-Öschelbronn (DE); Hoon Sik Kim, San Jose, CA (US); Terry C. Lam, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/506,784

(22) Filed: Nov. 10, 2023

(65) Prior Publication Data

US 2024/0079442 A1 Mar. 7, 2024

Related U.S. Application Data

(63) Continuation of application No. 17/542,129, filed on Dec. 3, 2021, now Pat. No. 11,862,664.

(60) Provisional application No. 63/136,955, filed on Jan. 13, 2021.

(51) Int. Cl.
| | |
|---|---|
| *H01L 27/15* | (2006.01) |
| *B32B 3/30* | (2006.01) |
| *B32B 17/10* | (2006.01) |
| *H01L 33/20* | (2010.01) |

(52) U.S. Cl.
CPC .............. *H01L 27/156* (2013.01); *B32B 3/30* (2013.01); *B32B 17/10* (2013.01); *H01L 33/20* (2013.01); *B32B 2457/20* (2013.01)

(58) Field of Classification Search
None
See application file for complete search history.

(56) References Cited

U.S. PATENT DOCUMENTS

| | | | |
|---|---|---|---|
| 6,104,464 A * | 8/2000 | Adachi | H05K 1/0278 349/150 |
| 9,189,027 B2 | 11/2015 | Lee et al. | |
| 9,516,743 B2 | 12/2016 | Kim et al. | |
| 9,811,120 B2 * | 11/2017 | Namkung | H05K 1/028 |
| 9,848,494 B2 | 12/2017 | Huitema et al. | |
| 9,935,279 B2 | 4/2018 | Lee et al. | |
| 10,104,787 B2 | 10/2018 | Rothkopf et al. | |
| 10,462,896 B1 | 10/2019 | Kwon et al. | |

(Continued)

*Primary Examiner* — Ryan Crockett
(74) *Attorney, Agent, or Firm* — Treyz Law Group, P.C.; G. Victor Treyz; Kendall P. Woodruff

(57) ABSTRACT

A foldable electronic device may bend about a bend axis. A foldable display panel may be configured to bend along the bend axis as the foldable device is folded. A display cover layer may overlap the display panel. The display panel may have an array of pixels configured to display an image viewable through the display cover layer. The display cover layer may be formed from a layer of glass. A recess may be formed in the layer of glass that runs parallel to the bend axis and that overlaps the bend axis. The recess forms a flexible locally thinned portion in the glass that allows the display cover layer to bend. A rough surface texture and polymer coating may be provided in the recess. The recess may have shallowly sloping walls.

20 Claims, 9 Drawing Sheets

(56) References Cited

U.S. PATENT DOCUMENTS

| | | |
|---|---|---|
| 2006/0146488 A1 | 7/2006 | Kimmel |
| 2013/0083496 A1 | 4/2013 | Franklin et al. |
| 2017/0054106 A1* | 2/2017 | Jeon ................... H10K 59/873 |
| 2020/0064628 A1* | 2/2020 | Mirabella ............ G02B 27/028 |
| 2020/0212340 A1* | 7/2020 | Ai ........................ H10K 50/841 |
| 2020/0260604 A1* | 8/2020 | Zhang ..................... H05K 5/03 |
| 2020/0298539 A1* | 9/2020 | Shibai ....................... B32B 3/30 |
| 2020/0313111 A1 | 10/2020 | Kim et al. |
| 2022/0055348 A1* | 2/2022 | Xiao ......................... B32B 7/12 |
| 2022/0201885 A1* | 6/2022 | Nguyen ................ G06F 1/1652 |
| 2022/0225523 A1* | 7/2022 | Nguyen ............... H10K 77/111 |

\* cited by examiner

ELECTRONIC DEVICES WITH FOLDING DISPLAYS HAVING TEXTURED FLEXIBLE AREAS

This application is a continuation of patent application Ser. No. 17/542,129, filed Dec. 3, 2021, which claims the benefit of provisional patent application No. 63/136,955, filed Jan. 13, 2021, both of which are hereby incorporated by reference herein in their entireties.

FIELD

This relates generally to electronic devices, and, more particularly, to electronic devices with displays.

BACKGROUND

Electronic devices often have displays. Portability may be a concern for some devices, which tends to limit available real estate for displays.

SUMMARY

An electronic device may be provided with a foldable housing that allows the device to fold and unfold about a bend axis. A flexible display may be mounted in the foldable housing. The flexible display may have an array of pixels forming a display panel. The display panel may be configured to bend along the bend axis as the device is folded.

The display panel may display images that are viewable through a transparent display cover layer that overlaps the display panel. The display cover layer may be formed from a layer of glass. An elongated groove or other recess may be formed in the layer of glass that runs parallel to the bend axis while overlapping the bend axis. The recess may form a flexible locally thinned portion in the glass layer. This thinned portion allows the display cover layer to bend as the foldable device is opened and closed.

Polymer may be placed in the recess to help planarize the inner side of the display cover layer adjacent to the display panel. To promote wetting and adhesion of the polymer in the recess and to help reduce reflections, the inner surface of thinned portion of the display cover may be provided with a rough texture. The thinned portion may have variable-thickness portions that transition in thickness between a minimum thinned portion thickness associated with the thinnest area of the thinned portion and a maximum display layer thickness associated with non-thinned portions of the display cover layer.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., diodes formed from crystalline semiconductor dies).

Figure 1:
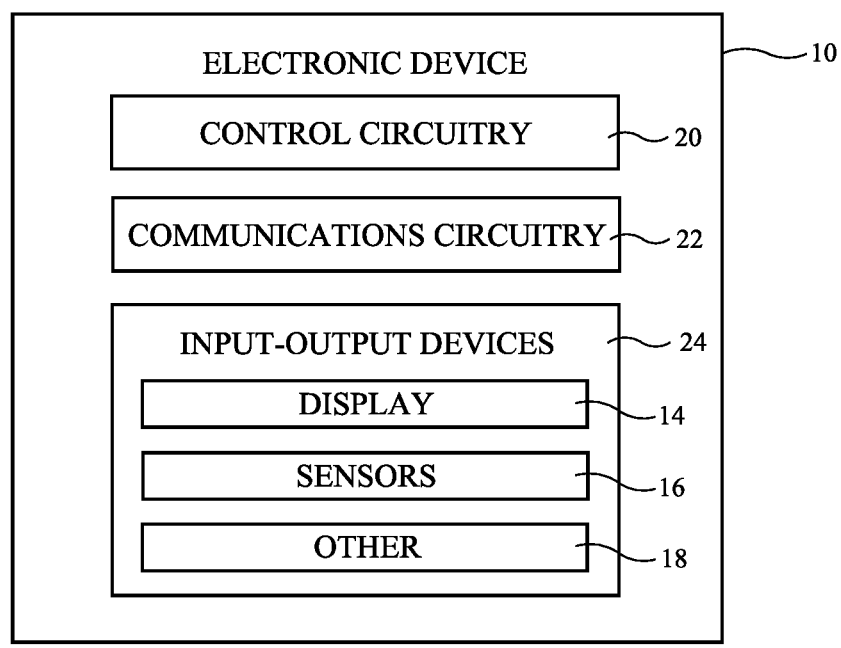
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed as part of a display panel that is bendable. This allows device 10 to be folded and unfolded about a bend axis. For example, a flexible (bendable) display in device 10 may be folded so that device 10 may be placed in a compact shape for storage and may be unfolded when it is desired to view images on the display.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
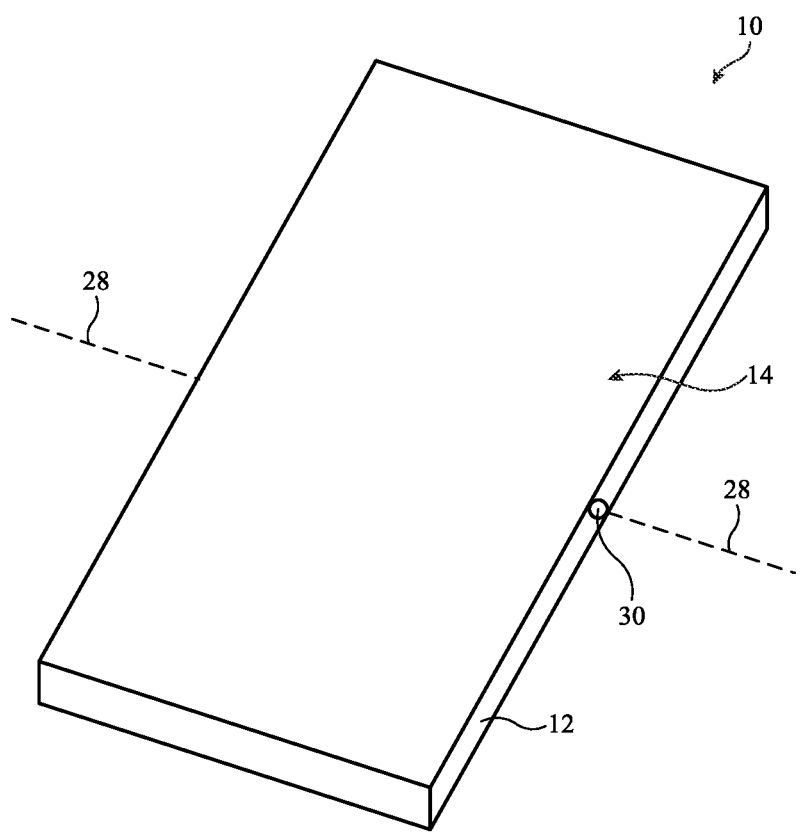
FIG. 2 is a perspective view of an illustrative electronic device with a display in accordance with an embodiment.

FIG. 2 is a perspective view of electronic device 10 in an illustrative configuration in which device 10 is a portable electronic device such as a cellular telephone or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14.

Display 14 may be mounted in housing 12. Housing 12 may form front and rear housing walls, sidewall structures, and/or internal supporting structures (e.g., a frame, an optional midplate member, etc.) for device 10. Glass structures, transparent polymer structures, and/or other transparent structures that cover display 14 and other portions of device 10 may provide structural support for device 10 and may sometimes be referred to as housing structures. For example, a transparent housing portion such as a glass or polymer housing structure that covers and protects a pixel array in display 14 may serve as a display cover layer for the pixel array while also serving as a housing wall on the front face of device 10. In configurations in which a display cover layer is formed from glass, the display cover layer may sometime be referred to as a display cover glass or display cover glass layer. The portions of housing 12 on the sidewalls and rear wall of device 10 may be formed from glass or other transparent structures and/or opaque structures. Sidewalls and rear wall structures may be formed as extensions to the front portion of housing 12 (e.g., as integral portions of the display cover layer) and/or may include separate housing wall structures.

Housing 12 may have flexible structures (e.g., bendable housing wall structures) and/or hinge structures such as hinge 30. Hinge 30 may have a hinge axis aligned with device bend axis 28. Hinge 30 and/or flexible housing structures that overlap bend axis 28 may allow housing 12 to bend about bend axis 28. For example, housing 12 may have a first portion on one side of bend axis 28 and a second portion on an opposing side of bend axis 28 and these two housing portions may be coupled by hinge 30 for rotational motion about axis 28.

As housing 12 is bent about bend axis 28, the flexibility of display 14 allows display 14 to bend about axis 28. In an illustrative configuration, housing 12 and display 14 may bend by 180°. This allows display 14 to be folded back on itself (with first and second outwardly-facing portions of display 14 facing each other). The ability to place device 10 in a folded configuration in this way may help make device 10 compact so that device 10 can be stored efficiently. When it is desired to view images on display 14, device 10 may be unfolded about axis 28 to place device 10 in the unfolded configuration of FIG. 2. This allows display 14 to lie flat and allows a user to view flat images on display 14. The ability to fold display 14 onto itself allows device 10 to exhibit an inwardly folding behavior. Display 14 may be sufficiently flexible to allow device 10 to be folded outwardly and/or inwardly.

Device 10 of FIG. 2 has a rectangular outline (rectangular periphery) with four corners. As shown in FIG. 2, a first pair of parallel edges (e.g., the left and right edges of device 10 in the example of FIG. 2) may be longer than a second pair of parallel edges (e.g., the upper and lower edges of device 10 of FIG. 2) that are oriented at right angles to the first pair of parallel edges. In this type of configuration, housing 12 is elongated along a longitudinal axis that is perpendicular to bend axis 28. Housing 12 may have other shapes, if desired (e.g., shapes in which housing 12 has a longitudinal axis that extends parallel to bend axis 28). With an arrangement of the type shown in FIG. 2, the length of device 10 along its longitudinal axis may be reduced by folding device 10 about axis 28.

Figure 3:
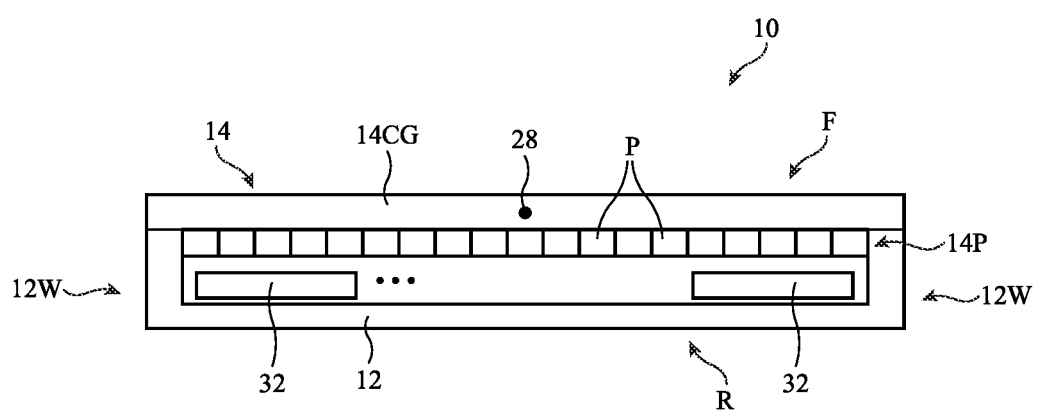
FIG. 3 is a cross-sectional side view of an illustrative electronic device in accordance with an embodiment.

FIG. 3 is a cross-sectional side view of an illustrative foldable electronic device. Device 10 of FIG. 3 may bend about bend axis 28. Bend axis 28 may be aligned with display cover layer 14CG or other structures in device 10. For example, bend axis 28 may pass through a portion of display cover layer 14CG or may be located above or below layer 14CG.

As shown in FIG. 3, display 14 includes an array of pixels P forming display panel 14P under an inwardly facing surface of display cover layer 14CG. Display panel 14P may be, for example, a flexible organic light-emitting diode display or a microLED display in which light-emitting pixels are formed on a flexible substrate layer (e.g., a flexible layer of polyimide or a sheet of other flexible polymer). Flexible support layer(s) for display 14 may also be formed from flexible glass, flexible metal, and/or other flexible structures.

Display cover layer 14CG may be formed from polymer, glass, crystalline materials such as sapphire, other materials, and/or combinations of these materials. To enhance flexibility, a portion of layer 14CG that overlaps bend axis 28 may be locally thinned (e.g., this portion may be thinned relative to portions of layer 14CG that do not overlap bend axis 28). The thickness of layer 14CG (e.g., the non-thinned portions of layer 14CG) may be 50-200 microns, 70-150 microns, 100-200 microns, 100-600 microns, at least 100 microns, at least 200 microns, less than 600 microns, less than 400 microns, less than 250 microns, less than 150 microns, less than 100 microns, at least 50 microns, or other suitable thickness.

In the example of FIG. 3, housing 12 has a portion on rear face R that forms a rear housing wall and has side portions forming sidewalls 12W. The rear housing wall of housing 12 may form a support layer for components in device 10. Housing 12 may also have one or more interior supporting layers (e.g., frame structures such as an optional midplate, etc.). These interior supporting layers and the rear housing wall may have first and second portions that are coupled to opposing sides of a hinge that is aligned with bend axis 28 (see, e.g., hinge 30 of FIG. 2) or may be sufficiently flexible to bend around bend axis 28.

Electrical components 32 may be mounted in the interior of device 10 (e.g., between display 14 and the rear of housing 12. Components 32 may include circuitry of the type shown in FIG. 1 (e.g., control circuitry 20, communications circuitry 22, input-output devices 24, batteries, etc.). Display 14 may be mounted on front face F of device 10. When device 10 is folded about axis 28, display cover layer 14CG, display panel 14P, and the other structures of device 10 that overlap bend axis 28 may flex and bend to accommodate folding.

Figure 4:
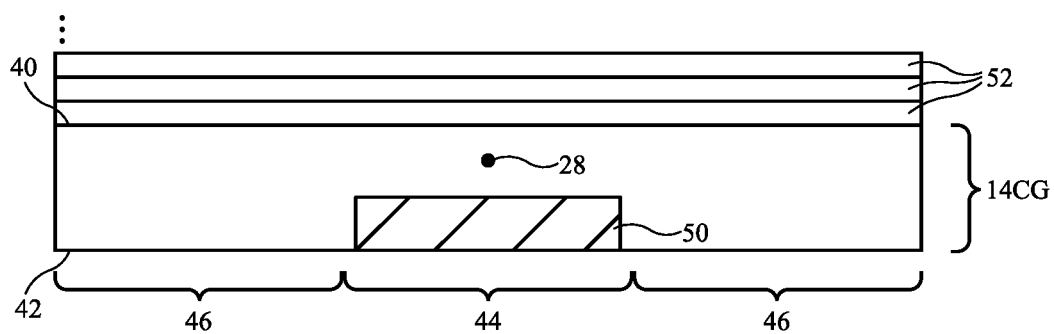
FIG. 4 is a cross-sectional side view of an illustrative display having a cover layer with a locally thinned hinge region in accordance with an embodiment.

The outer and/or inner surfaces of display cover layer 14GC may be provided with coatings. These coatings may include, for example, antireflection coatings, anti-scratch coatings, anti-smudge coatings, and/or other coating layers. Consider, as an example, the cross-sectional side view of display cover layer 14CG of FIG. 4. As shown in FIG. 4, display cover layer may have an outer surface (outwardly facing surface) such as surface 40 and an opposing inner surface (inwardly facing surface) such as surface 42. A strip-shaped region of display cover layer 14CG that overlaps and runs parallel to bend axis 28 may be locally thinned (e.g., a groove or other recess that runs parallel to bend axis 28 may be formed in layer 14CG to form locally thinned portion 44 of layer 14CG). Locally thinned portion 44 of layer 14CG may be thinner than other portions of layer 14CG such as non-thinned portions 46 (which may be, for example, planar glass layer portions of layer 14CG). The presence of portion 44 in display cover layer 14CG may facilitate bending of display cover layer 14CG about bend axis 28.

To help planarize inner surface 42 and thereby facilitate mounting of display panel 14P against inner surface 42 (e.g., with a layer of adhesive), the elongated recess (groove) in the inner surface of layer 14CG that forms thinned portion 44 may be filled with polymer 50. Polymer 50 may be sufficiently flexible to bend about bend axis 28 when device 10 is opened and closed. The refractive index of polymer 50 may be matched to that of display cover layer 14CG to help minimize light reflections (e.g., by incorporating inorganic nanoparticles in polymer 50). For example, at a wavelength of 500 nm, the refractive index of polymer 50 may differ from that of layer 14CG by less than 0.15, less than 0.1, or less than 0.05 (as examples).

Coating layers 52 may be formed on outer surface 40. Coating layers 52 may include, for example, anti-scratch layers (sometimes referred to as hard coats), protective polymer layers, anti-smudge layers, anti-fog layers, antireflection layers, anti-static layers, adhesion layers, and/or other coatings. In some configurations, each of these functions may be implemented using a separate respective coating layer. In other configurations, a single layer may serve multiple functions. In general, coatings such as coatings 52 may be formed on outer surface 40 and/or inner surface 42. In the illustrative configuration of FIG. 4, coatings 52 are formed on outer surface 40.

Coatings 52 may be provided in any suitable order. As one example, the lowermost coating of coatings 52 (e.g., a coating layer formed directly on surface 40 of FIG. 4) may be a hard coat or other anti-scratch layer that helps prevent scratches that could damage layer 14CG. An antireflection coating may be formed on top of the anti-scratch layer. The antireflection layer may be a thin-film interference filter antireflection coating containing a stack of thin-film layers such as dielectric sublayers of alternating refractive index. One of the thin-film layers may be a conductive layer such as a transparent semiconductor layer (e.g., an indium tin oxide layer) that serves as an antistatic layer. An anti-smudge coating or anti-fog coating may be formed on top of the antireflection layer. Anti-smudge coatings (e.g., hydrophobic polymer coatings) may help reduce fingerprints and other undesired marks on the surfaces of display 14. An example of an anti-smudge coating is a fluoropolymer coating (e.g., a fluoropolymer formed from evaporated perfluoropolyether) that serves as an oleophobic layer. Fluoropolymers can be adhered to underlying coating layers using an intervening adhesion layer.

Figure 5:
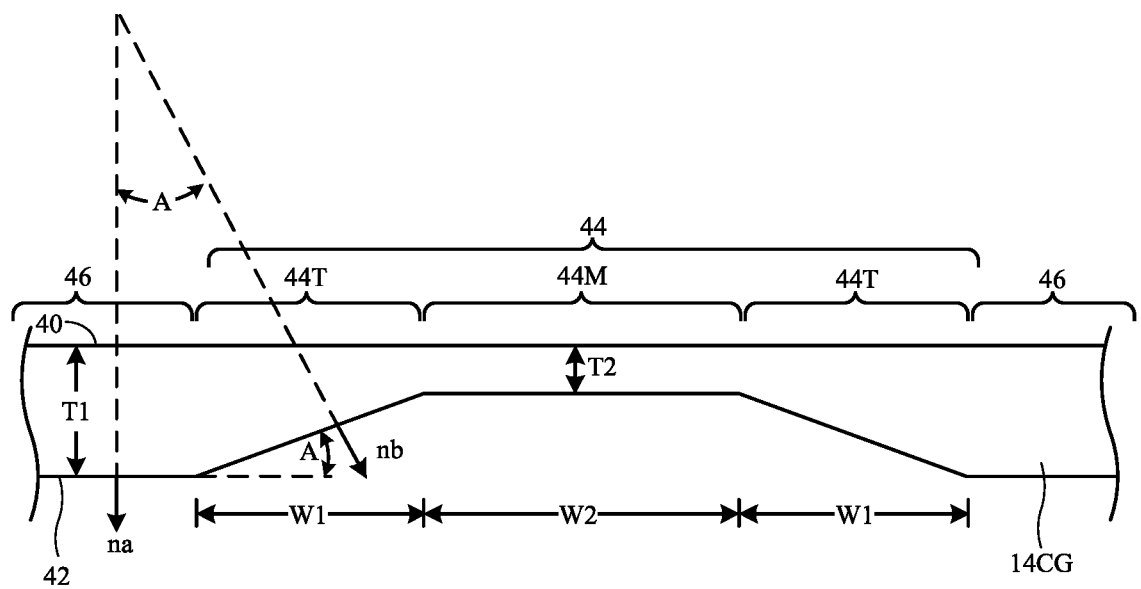
FIG. 5 is a cross-sectional side view of an illustrative locally thinned display cover layer in accordance with an embodiment.

It may be desirable to configure the cross-sectional profile of inner surface 42 of display cover layer 12 to help avoid distortion of the image on display panel 14P due to changes in the refraction of light from thickness variations. As shown in FIG. 5, for example, it may be desirable to provide locally thinned region 44 with varying thickness portions 44T. Portions 44T may be tapered and characterized by smoothly and slowly varying thicknesses. Portions 44T may be located at the outer edges of locally thinned region 44 and may provide layer 14CG with a gradual transition between the thinnest part of portion 44 (e.g., thinned portion 44M of portion 44 in FIG. 5) and the thicker portions of layer 14CG such as non-thinned portions 46. By gradually changing the thickness of layer 14CG, undesired visual artifacts and stress concentration features may be avoided.

In the example of FIG. 5, non-thinned portion 46 of display cover layer 14CG have a thickness T1. Minimum thickness portion 44M of locally thinned portion 44 of display cover layer 14CG has a thickness T2. In an illustrative configuration, thickness T1 is 50-200 microns, 70-150 microns, 100-200 microns, less than 250 microns, less than 150 microns, less than 100 microns, at least 50 microns, or other suitable thickness. Thickness T2, which is less than T1, is 30 microns, 10-50 microns, at least 7 microns, at least 15 microns, at least 25 microns, less than 100 microns, less than 75 microns, less than 50 microns, less than 40 microns, or other suitable thickness that is sufficiently thin to allow layer 14CG to be bent about bend axis 28 satisfactorily.

Inner surface 42 of display cover layer 14CG may have a curved or straight cross-sectional profile in portions 44T. In the example of FIG. 5, at least some of portions 44T have planar areas characterized by a relatively straight cross-sectional profile. As shown in FIG. 5, in portions 46, surface 42 (and opposing planar surface 40) of layer 14CG may be characterized by a vertical surface normal such as surface normal na, whereas in portions 44T, surface 42 of layer 14CG may be characterized by surface normal nb, which is angled away from na by angle A. To ensure that the transition between thickness T1 and T2 is sufficiently gradual, it may be desirable for the angle A between surface normals na and nb (which is equal to the angle of tilt between the planar horizontally extending inner surface of portions 46 and the planar inner surfaces of portions 44T of FIG. 5) to be relatively small. The value of angle A may be less than 45°, less than 30°, less than 20° less than 15°, less than 10°, less than 5°, 2-15° 3-10°, at least 1°, at least 4°, or other of suitable value. The width W2 of portion 44M may be at least 0.05 mm, at least 0.1 mm, at least 0.2 mm, at least 0.5 mm, at least 1 mm, at least 2 mm, at least 4 mm, at least 8 mm, at least 1.5 cm, less than 3 cm, less than 2 cm, less than 1 cm, less than 5 mm, less than 2 mm, or other suitable value. The width W1 of the transitions formed by varying thickness portions 44T may at least 1 mm, at least 2 mm, at least 4 mm, at least 8 mm, at least 1.5 cm, at least 3 cm, at least 8 cm, less than 12 cm, less than 5 cm, less than 3 cm, less than 2 cm, less than 1 cm, less than 5 mm, or other suitable value.

Figure 6:
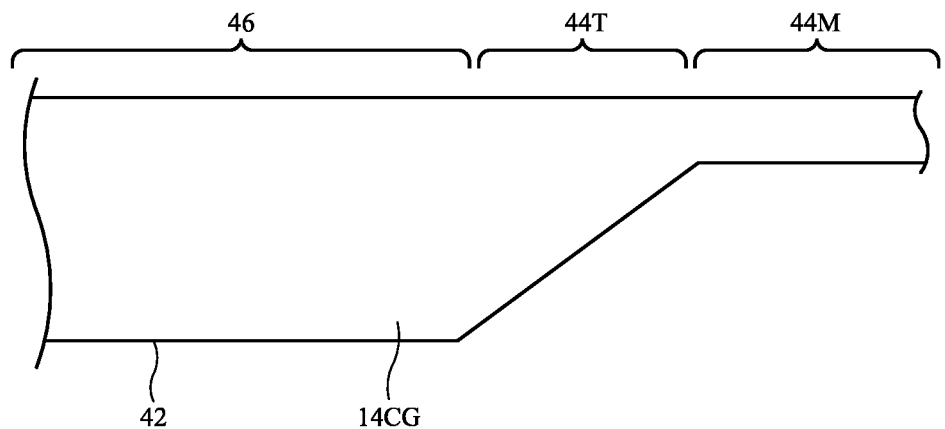
FIGS. 6 and 7 are cross-sectional side views of portions of locally thinned display cover layers in accordance with embodiments.
Figure 7:
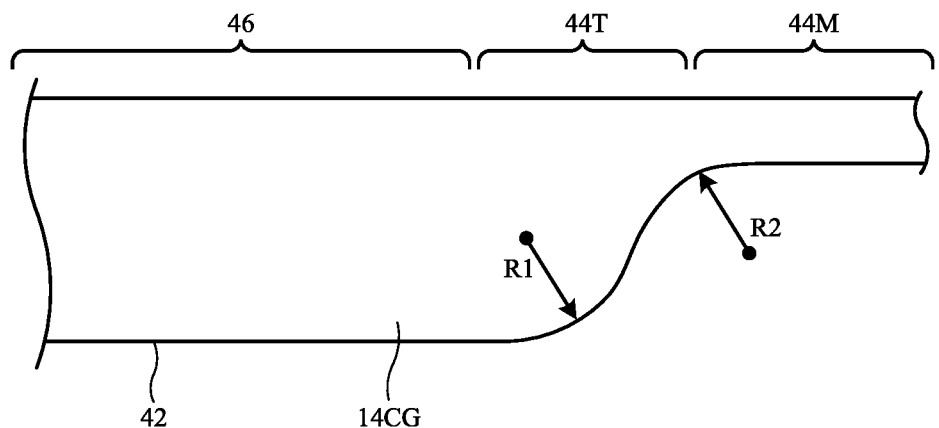

FIG. 6 is a cross-sectional side view of a portion of display cover layer 14CG in an illustrative configuration in which varying thickness portion 44T has a planar inner surface (e.g., a tilted portion of surface 42). As shown in the example of FIG. 7, the regions of surface 42 where portion 44M meets portions 44T and the regions of surface 42 where portions 44T meet portions 46 may have curved cross-sectional profiles (e.g., curved cross-sectional profiles characterized by respective radii of curvature R2 and R1, respectively). The values of R1 and R2 may be, for example, at least 0.05 mm, at least 0.1 mm, at least 0.2 mm, at least 1 mm, at least 1 cm, less than 2 cm, less than 5 mm, less than 3 mm, or other suitable value. By using surfaces with curved cross-sectional profiles for the transition zones between varying thickness portions 44T and adjacent portions of layer 14CG, stresses and visual artifacts due to the shape of display cover layer 14CG may be maintained at satisfactorily low levels.

Figure 8:
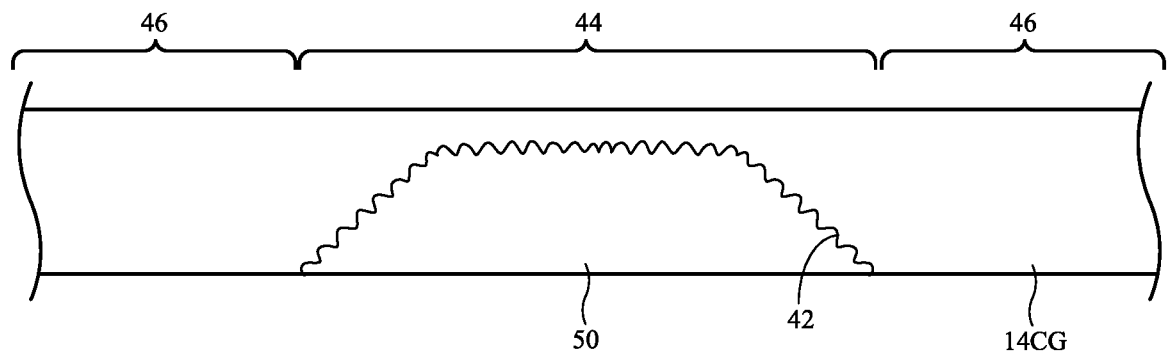
FIG. 8 is a cross-sectional side view of an illustrative display cover layer having a locally thinned portion with a rough surface texture in accordance with an embodiment.

As shown in FIG. 8, inner surface 42 of display cover layer 14CG may be provided with a rough texture. The texture of surface 42 may have a random or pseudorandom pattern and be provided on portion 44 of display cover layer 14CG and/or other portions of display cover layer 14CG. Polymer 50 may be deposited as a liquid in the groove formed from thinned portion 44 (e.g., under a vacuum) and subsequently cured (e.g., by applying light such as ultraviolet light, by applying heat, by using catalyst, and/or by using other curing techniques). Polymer 50 may be formed from a flexible material such as silicone or urethane acrylate (as examples). The presence of the rough random texture in surface 42 may help adhere polymer 50 to display cover layer 14CG. The texture may also help create a gradual change in effective refractive index as layer 14CG transitions to polymer 50, thereby helping to index discontinuities that could lead to light reflections at the glass-polymer interface. The random pattern of the texture may also help reduce specular light reflections at the interface between layer 14CG and polymer 50.

Figure 9:
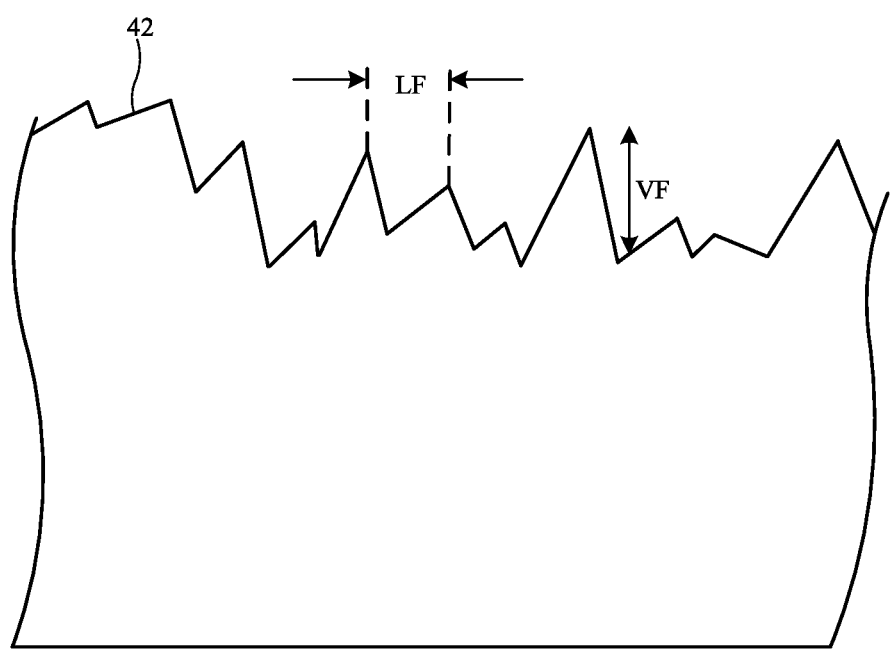
FIG. 9 is a cross-sectional side view of an illustrative display cover layer with a textured surface in accordance with an embodiment.

FIG. 9 is a cross-sectional side view of a portion of inner surface 42 having an illustrative rough texture. This texture may be formed, for example, by using a silicone mold or other structure to nano-imprint photoresist with desired surface relief features followed by plasma etching of surface 42 through the textured photoresist. If desired, thinned portion 44 and the texture of inner surface 42 in portion 44 may be formed using other techniques (e.g., machining, laser processing, wet etching in an etchant such as HF, plasma etching, and/or other glass thinning and texturing techniques). The use of plasma etching through a textured photoresist mask on inner surface 42 of portion 44 is illustrative.

The rough texture of surface 42 may be formed by randomly distributed protrusions (peaks). To help prevent light scattering from the features in the textured surface, the textured surface may be configured to exhibit small lateral roughness dimensions LF (e.g., peak-to-peak spacings and/or protrusion full-width-half-maximum values) of less than 1 micron. As an example, LF may be subwavelength in size (e.g., the mean value of the lateral surface roughness dimensions LF may be less than 400 nm, less than 300 nm, less than 200 nm, 50-300 nm, 30-400 nm, etc.). The mean height VF of the protrusions and/or other surface roughness features on surface 42 may be 200-400 nm, at least 50 nm, at least 100 nm, at least 300 nm, at least 500 nm, less than 1000 nm (1 micron), less than 700 nm, less than 500 nm, less than 350 nm, or less than 120 nm (as examples).

Figure 10:
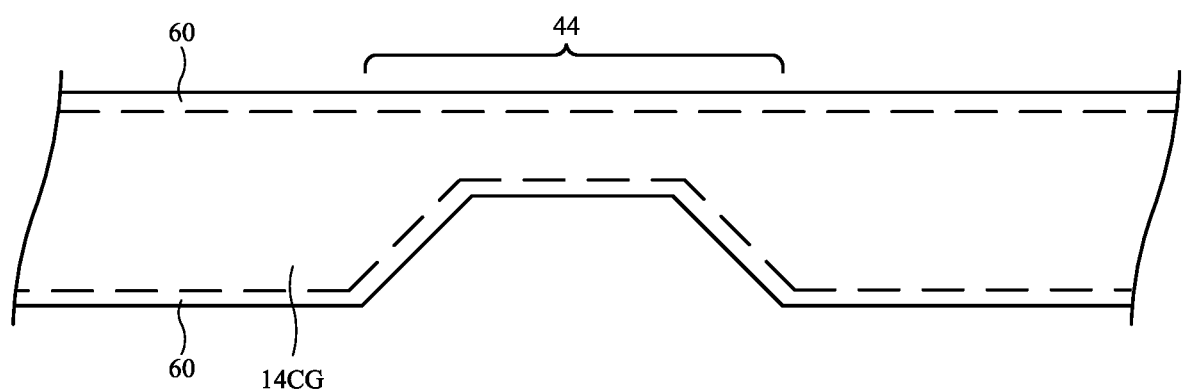
FIG. 10 is a cross-sectional side view of an illustrative display cover layer having a locally thinned bend axis region and chemical strengthened upper and lower surfaces in accordance with an embodiment.

As shown in FIG. 10, the inner and/or outer surface of display cover layer 14CG (in portions 44 and/or other portions of layer 14CG) may be chemically strengthened to form strengthened surface layers 60. As an example, layer 14CG may be formed from a glass (e.g., aluminosilicate glass) that is chemically strengthened by performing an ion-exchange process on the glass. During the ion-exchange process, smaller ions in the glass are replaced with larger ions. For example, sodium in the glass at the surface of layer 14CG may be replaced by potassium. This creates compressive stress in treated surface layers 60 that helps the glass resist damage from scratching and other wear.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a housing having first and second housing portions that rotate relative to one another about an axis;
   a display supported by the housing and having a first display portion overlapping the first housing portion and a second display portion overlapping the second housing portion, wherein the display is configured to display images across the axis; and
   a cover layer supported by the housing, wherein the cover layer has first and second rigid portions joined by a flexible portion, wherein the first and second rigid portions respectively overlap the first and second display portions, and wherein the flexible portion overlaps the axis and comprises a roughened glass surface.

2. The electronic device defined in claim 1 wherein the flexible portion has a reduced thickness relative to the first and second rigid portions.

3. The electronic device defined in claim 1 wherein the flexible portion has a groove and wherein the roughened glass surface is located in the groove.

4. The electronic device defined in claim 3 wherein the groove has sloped sidewalls.

5. The electronic device defined in claim 3 further comprising a polymer material in the groove.

6. The electronic device defined in claim 5 wherein the roughened glass surface creates a gradual change in refractive index between the cover layer and the polymer material to reduce light reflections at an interface between the cover layer and the polymer material.

7. The electronic device defined in claim 5 wherein the polymer material comprises silicone.

8. The electronic device defined in claim 1 wherein the cover layer comprises first and second chemically strengthened surfaces.

9. The electronic device defined in claim 1 wherein the roughened glass surface comprises randomly distributed protrusions.

10. The electronic device defined in claim 9 wherein the randomly distributed protrusions have mean heights of less than 1 micron and mean lateral dimensions of less than 1 micron.

11. An electronic device, comprising:
a foldable housing;
a foldable display;
a display cover layer, wherein the foldable housing, the foldable display, and the display cover layer are configured to fold along an axis and wherein the display cover layer has a groove that overlaps the axis; and
a polymer material in the groove, wherein the display cover layer has a roughened surface in the groove to produce a gradual change in refractive index between the display cover layer and the polymer material.

12. The electronic device defined in claim 11 wherein the display cover layer comprises glass and the roughened surface comprises a roughened glass surface.

13. The electronic device defined in claim 12 wherein the roughened glass surface comprises randomly distributed protrusions to reduce light reflections at a glass-polymer interface between the display cover layer and the polymer material.

14. The electronic device defined in claim 11 wherein the groove has sloped sidewalls and the roughened surface is formed on the sloped sidewalls.

15. The electronic device defined in claim 11 wherein the display cover layer comprises first and second chemically strengthened surfaces.

16. An electronic device, comprising:
a housing having an upper housing portion and a lower housing portion that rotate relative to one another about a hinge;
a foldable display that overlaps the upper and lower housing portions and extends across the hinge;
a display cover layer that overlaps the foldable display, wherein the display cover layer has a locally thinned portion overlapping the hinge and wherein the locally thinned portion has sloped sidewalls with a roughened surface; and
a polymer material on the roughened surface, wherein the roughened surface reduces light reflections at an interface between the display cover layer and the polymer material.

17. The electronic device defined in claim 16 wherein the roughened surface comprises randomly distributed protrusions that create a gradual change in refractive index between the display cover layer and the polymer material.

18. The electronic device defined in claim 16 wherein the display cover layer comprises glass and the roughened surface comprises a roughened glass surface.

19. The electronic device defined in claim 16 wherein the polymer material comprises silicone that covers the roughened surface.

20. The electronic device defined in claim 16 wherein the display cover layer comprises first and second chemically strengthened surfaces.

* * * * *